(12) United States Patent
Futamura et al.

(10) Patent No.: US 11,039,561 B2
(45) Date of Patent: Jun. 15, 2021

(54) COMPONENT MOUNTING SYSTEM AND ADHESIVE INSPECTION DEVICE

(71) Applicant: CKD Corporation, Aichi (JP)

(72) Inventors: Ikuo Futamura, Aichi (JP); Tsuyoshi Ohyama, Aichi (JP); Norihiko Sakaida, Aichi (JP); Kazuyoshi Kikuchi, Aichi (JP)

(73) Assignee: CKD CORPORATION, Aichi (JP)

( * ) Notice: Subject to any disclaimer, the term of this patent is extended or adjusted under 35 U.S.C. 154(b) by 72 days.

(21) Appl. No.: 16/574,412

(22) Filed: Sep. 18, 2019

(65) Prior Publication Data

US 2020/0015396 A1 Jan. 9, 2020

Related U.S. Application Data

(63) Continuation of application No. PCT/JP2017/036445, filed on Oct. 6, 2017.

(30) Foreign Application Priority Data

Apr. 13, 2017 (JP) .............................. JP2017-079736

(51) Int. Cl.
    *B23K 31/00* (2006.01)
    *H05K 13/08* (2006.01)
    (Continued)

(52) U.S. Cl.
    CPC ......... *H05K 13/0813* (2018.08); *B23K 31/02* (2013.01); *G01B 11/0608* (2013.01);
    (Continued)

(58) Field of Classification Search
    CPC .. B23K 1/0016; B23K 2101/42; B23K 1/008; B23K 31/12; B23K 11/0086;
    (Continued)

(56) References Cited

U.S. PATENT DOCUMENTS 8,837,809 B2 * 9/2014 Jeong ........................ G06T 7/70
                                                        382/149
9,711,483 B2 * 7/2017 Wada ........................ B23K 3/08
(Continued)

FOREIGN PATENT DOCUMENTS

JP     H10-303596 A    11/1998
JP     2006-313100 A    11/2006
(Continued)

OTHER PUBLICATIONS

International Search Report issued in International Application No. PCT/JP2017/036445, dated Jan. 9, 2018 (3 pages).

(Continued)

*Primary Examiner* — Erin B Saad
(74) *Attorney, Agent, or Firm* — Osha Bergman Watanabe & Burton LLP

(57) ABSTRACT

A component mounting system includes: a component mounting machine that mounts an electronic component having a predetermined electrode portion on a solder printed on a substrate, the electronic component being fixed to the substrate with a thermosetting adhesive; and an adhesive inspection device. The component mounting machine: sets, with regard to the electronic component to be fixed with the adhesive that cures at a temperature lower than a melting temperature of the solder, a target mounting height along a height direction perpendicular to a face of the substrate on which the adhesive is applied; and mounts the electronic component at the target mounting height. The target mounting height is: an ideal mounting height based on design data; or a height lower than the ideal mounting height by a value that corresponds to a sinking of the electronic component as a result of melting of the solder.

14 Claims, 5 Drawing Sheets

(51) Int. Cl.
  *G06T 7/50* (2017.01)
  *B23K 31/02* (2006.01)
  *G01B 11/06* (2006.01)
  *G01B 11/25* (2006.01)
  *G01N 21/95* (2006.01)
  *G06T 7/00* (2017.01)
  *H05K 3/34* (2006.01)
  *B23K 101/42* (2006.01)

(52) U.S. Cl.
  CPC ............ *G01B 11/25* (2013.01); *G01N 21/95* (2013.01); *G06T 7/0004* (2013.01); *G06T 7/50* (2017.01); *H05K 3/341* (2013.01); *H05K 13/0812* (2018.08); *H05K 13/0817* (2018.08); *B23K 2101/42* (2018.08); *G06T 2207/30141* (2013.01); *G06T 2207/30152* (2013.01); *H05K 2203/163* (2013.01)

(58) Field of Classification Search
  CPC ................. B23K 37/0443; B23K 3/00; G06T 2207/30152; G06T 2207/10152
  See application file for complete search history.

(56) References Cited

U.S. PATENT DOCUMENTS

2009/0097738 A1* 4/2009 Mamiya .................. G06T 7/136
  382/150
2011/0249096 A1* 10/2011 Umemura .......... G01B 11/0608
  348/46

FOREIGN PATENT DOCUMENTS

JP  2011-220934 A  11/2011
JP  2012-59814 A  3/2012

OTHER PUBLICATIONS

Notification Concerning Transmittal of Copy of International Preliminary Report on Patentability for International Application No. PCT/JP2017/036445 dated Oct. 24, 2019 (1 page).
International Preliminary Report on Patentability issued in PCT/JP2017/036445 dated Oct. 15, 2019, with translation (11 pages).

* cited by examiner

COMPONENT MOUNTING SYSTEM AND ADHESIVE INSPECTION DEVICE

BACKGROUND

Technical Field

The present invention relates to a component mounting system configured to mount an electronic component on a substrate such as a printed circuit board, as well as to an adhesive inspection device configured to perform an inspection of an adhesive applied on the substrate.

Description of Related Art

A general procedure of mounting electronic components on a printed circuit board first prints solder paste on electrode patterns laid on the printed circuit board. The procedure subsequently applies a thermosetting adhesive on the printed circuit board, with a view to preventing the electronic components from dropping off, for example, when the printed circuit board passes through a predetermined reflow furnace. The adhesive is applied generally when electronic components are mounted on both faces of the printed circuit board. After application of the adhesive, the procedure temporarily sticks the electronic components on the printed circuit board with the solder paste printed thereon by taking advantage of the viscosity of the solder paste. In this state, the electronic components that are fixation targets by the adhesive are in contact with the adhesive.

After mounting of the electronic components, the printed circuit board is led to the reflow furnace to be subjected to a predetermined reflow process for soldering. In general, each electronic component has a plurality of electrode portions (electrodes and leads). The respective electrode portions are joined with different pieces of the solder paste. When the printed circuit board is subjected to the reflow process, the adhesive cures to firmly fix the electronic components.

An inspection is performed with regard to the state of printing the solder paste in a stage prior to the reflow process. A recently proposed component mounting system includes a solder inspection device configured to perform an inspection of solder paste and a component mounting machine configured to correct a mounting position of each electronic component based on information obtained by the solder inspection device (as described in, for example, Patent Literature 1).

In this component mounting system, the solder inspection device performs three-dimensional measurement of solder paste and subsequently performs an inspection of the solder paste, based on results of this measurement. Planar position information of the solder paste obtained by the three-dimensional measurement and position information in a height direction that is perpendicular to a predetermined inspection target face (for example, a face of the printed circuit board which the solder paste is printed on, as an inspection target) are output from the solder inspection device to the component mounting machine. The component mounting machine corrects a mounting position of each electronic component based on the input information and then mounts the electronic component. For example, when an actual height of solder paste actually printed is larger than an ideal height of the solder paste on design data, the component mounting machine mounts an electronic component at a position higher than an ideal mounting height of the electronic component based on design data.

PATENT LITERATURE

Patent Literature 1: JP 2006-313100A

When the adhesive has a curing temperature that is lower than a melting temperature of the solder paste, however, the adhesive cures to fix the electronic component prior to melting of the solder paste to wet and spread. Accordingly, when the component mounting system described above works to correct the mounting height of the electronic component according to a variation in height of the solder paste, curing the adhesive causes the electronic component to be fixed at a position of the corrected height. Such correction may cause the electronic component to be mounted at a position higher than an ideal mounting height. This is likely to cause the electronic component to be protruded from an ordinary placement position and is thereby likely to cause a dimensional error. Additionally, this is also likely to cause the electrode portion of the electronic component to be separated from the electrode pattern of the substrate and is thereby likely to cause soldering failure. The occurrence of the dimensional error or the soldering failure results in reducing the yield.

SUMMARY

One or more embodiments of the present invention provide a component mounting system configured to achieve enhancement of yield and the like.

The following describes functions and advantageous effects of one or more embodiments.

According to one or more embodiments, there is provided a component mounting system provided with a component mounting machine to mount an electronic component having a predetermined electrode portion, on a solder printed on a substrate and configured to fix the electronic component to the substrate by using a thermosetting adhesive.

The component mounting system comprises a solder inspection device. The solder inspection device comprises an irradiation unit configured to irradiate the solder with predetermined light; an imaging unit configured to take an image of at least the solder that is irradiated with the light by the irradiation unit; a three-dimensional measurement unit configured to perform three-dimensional measurement of the solder, based on the image taken by the imaging unit; a solder good/poor quality determination unit configured to determine good/poor quality of the solder, based on a result of the measurement by the three-dimensional measurement unit; and an output unit configured to output information including height-related information of the solder along a height direction that is perpendicular to a face of the substrate which the adhesive is applied on, based on the result of the measurement by the three-dimensional measurement unit.

The component mounting machine is provided with a mounting height setting unit to set at least a target mounting height of the electronic component along the perpendicular height direction, based on the information input from the output unit, and is configured to mount the electronic component at the target mounting height set by the mounting height setting unit.

With regard to the electronic component which is to be fixed by the adhesive that cures at a temperature lower than a melting temperature of the solder, the mounting height setting unit is configured to set the target mounting height to an ideal mounting height based on design data or to a height that is lower than the ideal mounting height by a value corresponding to sinking of the electronic component accompanied with melting of the solder.

The "ideal mounting height based on the design data" denotes a mounting height of an electronic component relative to a substrate, which is set in advance in design data (the same applies hereinafter).

According to one or more embodiments, the component mounting machine has the mounting height setting unit configured to set the target mounting height of the electronic component, based on the result of the measurement of the solder by the three-dimensional measurement unit. The component mounting machine is configured to mount the electronic component at the set target mounting height. This configuration accordingly enables the electronic component to be placed at a more appropriate position according to the state of formation of the solder. For example, this configuration enables an electronic component which is to be fixed by an adhesive that cures at a temperature higher than the melting temperature of the solder, to be placed at a mounting height corresponding to the actual height of the solder.

As described above, the component mounting machine is configured to appropriately change the mounting height of the electronic component. According to one or more embodiments, on the other hand, with regard to the electronic component which is to be fixed by the adhesive that cures at the temperature lower than the melting temperature of the solder, the mounting height setting unit sets the target mounting height to the ideal mounting height based on the design data or to the height that is lower than the ideal mounting height by the value corresponding to sinking of the electronic component accompanied with melting of the solder. Accordingly, the target mounting height of the electronic component which is to be fixed by the adhesive that cures at the temperature lower than the melting temperature of the solder, is set to the ideal mounting height or the like, irrespective of the amount (height) of the solder. When the adhesive cures to fix the electronic component prior to melting of the solder, the electronic component is placed at an ordinary placement position (ideal mounting height) or at a lower position than this ordinary placement position. This configuration thus more reliably prevents the electronic component from being fixed at a position protruded from the ordinary placement position and thereby prevents the occurrence of a dimensional error. Additionally, this configuration more effectively ensures electrical contact between electrode portions (including electrodes and leads placed on solders) of the electronic component and electrodes (including electrode patterns and lands) on the substrate side and more reliably prevents the occurrence of soldering failure. As a result, this enhances the yield.

The target mounting height may be set to the height that is lower than the ideal mounting height by the value corresponding to sinking of the electronic component accompanied with melting of the solder. When the adhesive cures prior to melting of the solder, such setting enables the electronic component to be fixed by this curing adhesive at a more appropriate position that is determined by taking into account the amount of sinking accompanied with melting of the solder. This configuration thus more effectively ensures the electrical contact between the electrode portions of the electronic component and the electrodes on the substrate side and thereby further enhances the yield.

According to one or more embodiments, there is provided a component mounting system provided with a component mounting machine to mount an electronic component having a predetermined electrode portion, on a solder printed on a substrate and configured to fix the electronic component to the substrate by using a thermosetting adhesive.

With regard to the electronic component which is to be fixed by the adhesive that cures at a temperature lower than a melting temperature of the solder, the component mounting machine is configured to set a target mounting height along a height direction that is perpendicular to a face of the substrate which the adhesive is applied on, to an ideal mounting height based on design data or to a height that is lower than the ideal mounting height by a value corresponding to sinking of the electronic component accompanied with melting of the solder and to mount the electronic component at the target mounting height.

According to one or more embodiments, with regard to the electronic component which is to be fixed by the adhesive that cures at the temperature lower than the melting temperature of the solder, the component mounting machine sets the target mounting height to the ideal mounting height based on the design data or to the height that is lower than the ideal mounting height by the value corresponding to sinking of the electronic component accompanied with melting of the solder. Accordingly, the target mounting height of the electronic component which is to be fixed by the adhesive that cures at the temperature lower than the melting temperature of the solder, is set to the ideal mounting height or the like, irrespective of the amount (height) of the solder. The component mounting machine then mounts the electronic component at the target mounting height. When the adhesive cures to fix the electronic component prior to melting of the solder, the electronic component is placed at an ordinary placement position (ideal mounting height) or at a lower position than this ordinary placement position. This configuration thus more reliably prevents the electronic component from being fixed at a position protruded from the ordinary placement position and thereby prevents the occurrence of a dimensional error. Additionally, this configuration more effectively ensures electrical contact between electrode portions (including electrodes and leads placed on solders) of the electronic component and electrodes (including electrode patterns and lands) on the substrate side and more reliably prevents the occurrence of soldering failure. As a result, this enhances the yield.

The target mounting height may be set to the height that is lower than the ideal mounting height by the value corresponding to sinking of the electronic component accompanied with melting of the solder. When the adhesive cures prior to melting of the solder, such setting enables the electronic component to be fixed by this curing adhesive at a more appropriate position that is determined by taking into account the amount of sinking accompanied with melting of the solder. This configuration thus more effectively ensures the electrical contact between the electrode portions of the electronic component and the electrodes on the substrate side and thereby further enhances the yield.

According to one or more embodiments, the component mounting system described above may further comprise an adhesive inspection device. The adhesive inspection device may comprise an adhesive height measurement unit configured to measure a height of the adhesive relative to the substrate; and an adhesive good/poor quality determination unit configured to determine good/poor quality of the adhesive, based on the height of the adhesive measured by the adhesive height measurement unit.

When the adhesive that is a determination target of the adhesive good/poor quality determination unit, is specified as a determination target adhesive, and the electronic component that is a fixation target to be fixed by the determination target adhesive, is specified as a fixation target electronic component, the adhesive good/poor quality determination unit may determine whether a height of the determination target adhesive is equal to a predetermined inspection reference height that is based on a target mounting height of the fixation target electronic component, irrespective of an amount of the solder which the fixation target electronic component is mounted on, and may thus determine good/poor quality of the determination target adhesive.

The "inspection reference height" is based on an ideal mounting height of the electronic component set in design data or based on a height that is lower than the ideal mounting height by a value corresponding to sinking of the electronic component accompanied with melting of the solder. In other words, the "inspection reference height" denotes a height at a location where the electronic component comes into contact with the adhesive, when the electronic component is mounted at the target mounting height. The inspection reference height is generally not specified strictly by one numerical value but is specified by a numerical range having a certain width, for example, a numerical range of not less than a predetermined lower limit value or a numerical range from a predetermined lower limit value to a predetermined upper limit value (the same applies hereinafter).

An inspection may be performed with regard to the state of application of the adhesive in a stage prior to a reflow process. A technical concept of the component mounting system to correct the mounting height of the electronic component according to the height of the solder may be applied to a technique of inspecting the adhesive. More specifically, an applicable technique may change the inspection reference height that is used as an inspection reference with regard to the height of the adhesive, based on the amount (height) of the solder and may use the changed inspection reference height to inspect the height of the adhesive.

This inspection technique, however, provides the higher setting of the inspection reference height when the solder has a large amount (when the solder has a large height). This is accordingly likely to increase the probability that the adhesive is determined poor due to an insufficient height, despite that the adhesive actually has no substantial problem for fixation of the electronic component and the like. As a result, this increases the likelihood that the adhesive that is supposed to be determined good is determined poor and results in reducing the yield.

According to one or more embodiments, on the other hand, an inspection of the determination target adhesive is performed by determining whether the height of the determination target adhesive is equal to the predetermined inspection reference height that is based on the target mounting height of the fixation target electronic component, irrespective of the amount of the solder. In other words, an inspection of the determination target adhesive is performed, based on the inspection reference height that is not changed according to a variation in amount (for example, height) of the solder. Accordingly, compared with a configuration that changes the inspection reference height according to a variation in amount (height) of the solder, this configuration reduces the probability that the adhesive is determined poor due to an insufficient height, despite that the adhesive actually has no substantial problem for fixation of the electronic component and the like. As a result, this configuration ensures the more accurate good-quality determination of the adhesive that is supposed to be determined good, and thereby further enhances the yield.

Additionally, according to one or more embodiments, the inspection reference height is based on the target mounting height of the fixation target electronic component, so that an inspection of the adhesive is performed according to the mounting height of the fixation target electronic component. As a result, this configuration ensures the more accurate good/poor quality determination of the adhesive.

According to one or more embodiments, in the component mounting system described above, the inspection reference height may be determined by taking into account a difference in height between the electrode portion included in the fixation target electronic component and a bottom face of the fixation target electronic component.

According to one or more embodiments, the inspection reference height is determined by taking into account a difference in height between an electrode portion of the fixation target electronic component and a bottom face of the fixation target electronic component. For example, the inspection reference height is determined, based on a difference in height between a location of the electrode portion that comes into contact with the solder and the bottom face. Accordingly, this configuration enables an inspection to be performed more accurately to determine whether the determination target adhesive comes into contact with the bottom face of the fixation target electronic component, i.e., whether the fixation target electronic component is allowed to be fixed by the adhesive, without taking into account the detailed shape of the electronic component. This ensures the more accurate good/poor quality determination of the adhesive by a relatively simple technique and further enhances the yield.

According to one or more embodiments, there is provided an adhesive inspection device configured to perform an inspection of a thermosetting adhesive after application of the adhesive on at least one face out of a surface and a rear face of a substrate to fix an electronic component to the at least one face and before mounting of the electronic component on a solder printed on the substrate. The adhesive inspection device comprises an adhesive height measurement unit configured to measure a height of the adhesive relative to the substrate; and an adhesive good/poor quality determination unit configured to determine good/poor quality of the adhesive, based on the height of the adhesive measured by the adhesive height measurement unit.

When the adhesive that is a determination target of the adhesive good/poor quality determination unit, is specified as a determination target adhesive, and the electronic component that is a fixation target to be fixed by the determination target adhesive, is specified as a fixation target electronic component, the adhesive good/poor quality determination unit determines whether a height of the determination target adhesive is equal to a predetermined inspection reference height that is based on an ideal mounting height of the fixation target electronic component on design data or based on a height that is lower than the ideal mounting height by a value corresponding to sinking of the fixation target electronic component accompanied with melting of the solder, irrespective of an amount of the solder which the fixation target electronic component is mounted on, and thereby determines good/poor quality of the determination target adhesive.

According to one or more embodiments, an inspection of the determination target adhesive is performed by determining whether the height of the determination target adhesive is equal to the predetermined inspection reference height that is based on the ideal mounting height of the fixation target electronic component on the design data or the like, irrespective of the amount of the solder. In other words, an inspection of the determination target adhesive is performed, based on the inspection reference height that is not changed according to a variation in amount (for example, height) of the solder. Accordingly, compared with a configuration that changes the inspection reference height according to a variation in amount (height) of the solder, this configuration reduces the probability that the adhesive is determined poor due to an insufficient height, despite that the adhesive actually has no substantial problem for fixation of the fixation target electronic component and the like. As a result, this configuration ensures the more accurate good-quality determination of the adhesive that is supposed to be determined good, and thereby further enhances the yield.

The configuration of one or more embodiments described above is used when the curing temperature of the determination target adhesive is lower than the melting temperature of the solder that is used to fix the fixation target electronic component. In this case, it is effective to set the target mounting height of the fixation target electronic component by the component mounting machine to an ideal mounting height of the fixation target electronic component based on design data or to a height that is lower than the ideal mounting height by a value corresponding to sinking of the fixation target electronic component accompanied with melting of the solder, as described above. In the case of setting the target mounting height in this manner, the configuration of one or more embodiments enables an inspection of the adhesive to be performed according to the mounting height of the fixation target electronic component and thus determines the good/poor quality of the adhesive more accurately.

According to one or more embodiments, in the adhesive inspection device described above, the inspection reference height may be determined by taking into account a difference in height between an electrode portion included in the fixation target electronic component and a bottom face of the fixation target electronic component.

The one or more embodiments described above have similar functions and advantageous effects.

DETAILED DESCRIPTION

Figure 1:
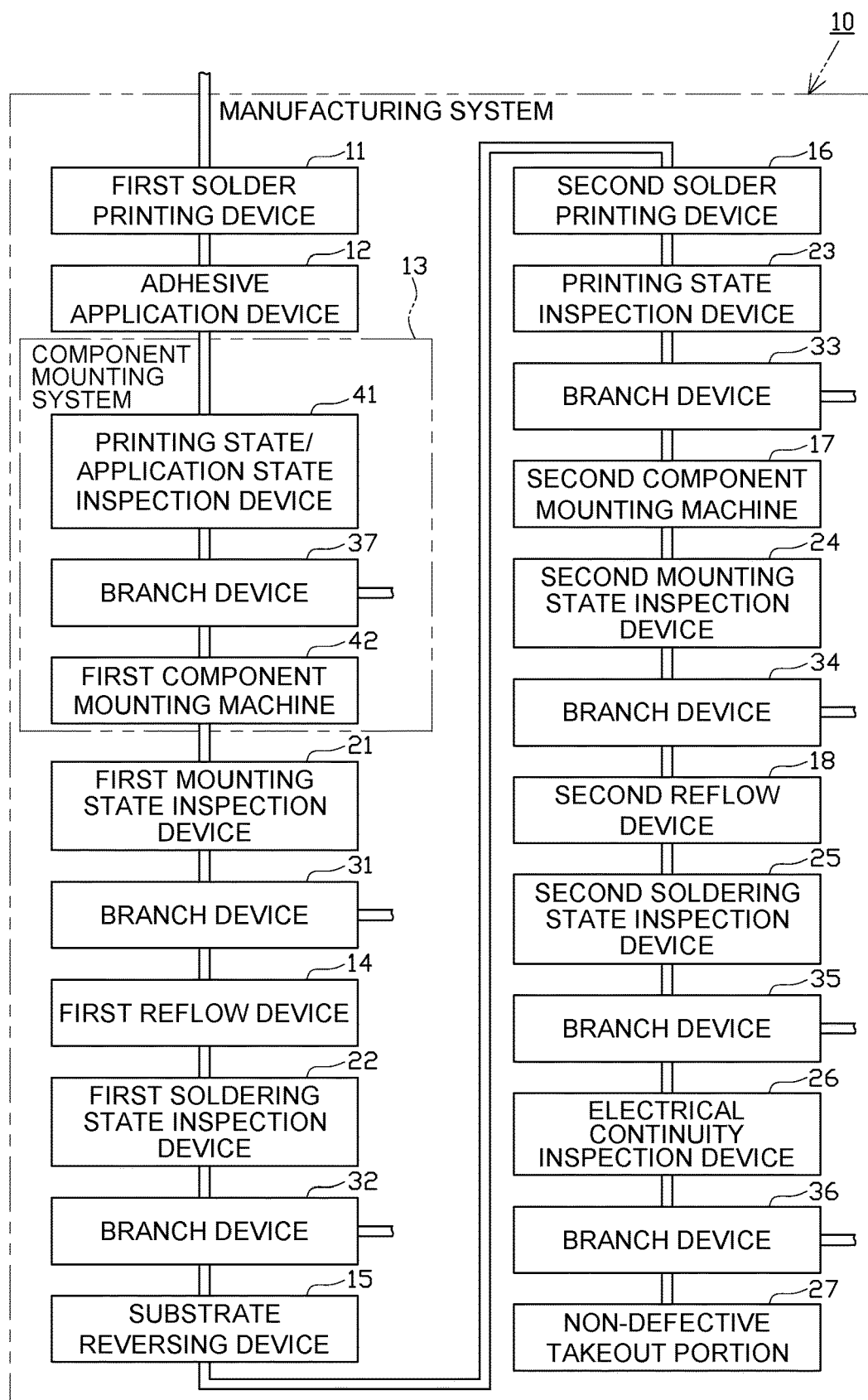
FIG. 1 is a block diagram illustrating the schematic configuration of a manufacturing system according to one or more embodiments.
Figure 2:
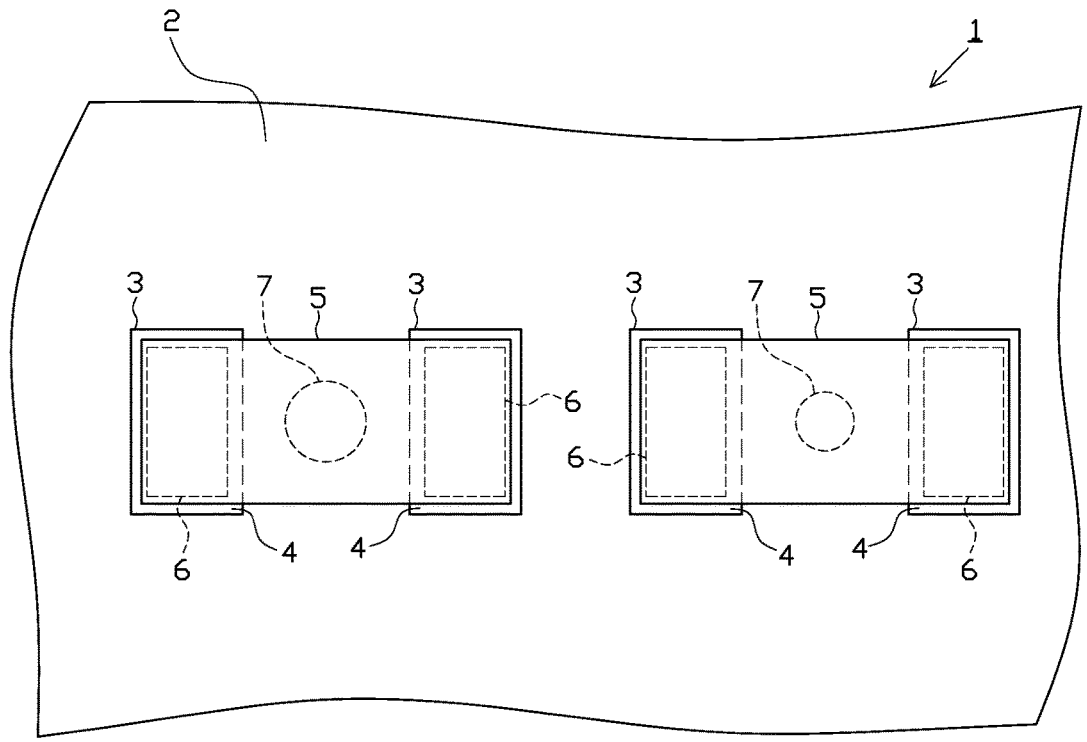
FIG. 2 is a partially enlarged plan view illustrating the schematic configuration of a mounted substrate according to one or more embodiments.
Figure 3:
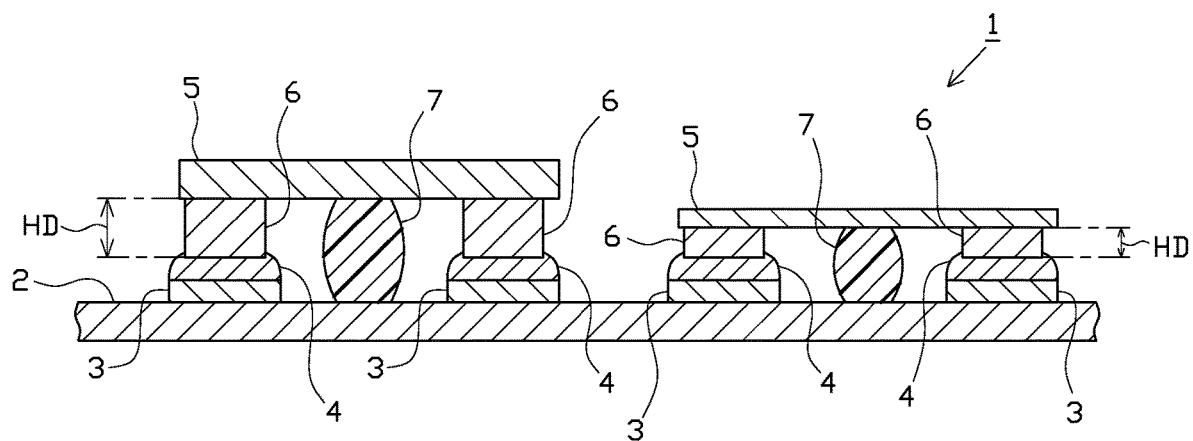
FIG. 3 is a partially enlarged sectional view illustrating the schematic configuration of the mounted substrate according to one or more embodiments.

The following describes embodiments of the present invention with reference to drawings. FIG. 1 is a block diagram illustrating the schematic configuration of a manufacturing system 10 to manufacture a mounted substrate by mounting electronic components and the like on a substrate such as a printed circuit board. FIG. 2 is a partially enlarged plan view illustrating part of a mounted substrate 1. FIG. 3 is a partially enlarged sectional view illustrating part of the mounted substrate 1.

The configuration of the mounted substrate 1 is described first. As shown in FIG. 2 and FIG. 3, the mounted substrate 1 includes a flat plate substrate 2 with a plurality of electrically conductive electrode patterns 3 arranged thereon. Solder paste (hereinafter referred to as "solder") 4 having viscosity is printed on the electrode patterns 3. In FIG. 3 and the like, the electrode patterns 3 and the like are exaggerated to have extremely large thicknesses.

The solder 4 used may be, for example, an Sn—Ag-based solder such as Sn-3.0 Ag-0.5 Cu or Sn-0.3 Ag-0.7 Cu, an Sn—Cu-based solder such as Sn-0.7 Cu, an Sn—Zn-based solder such as Sn-8 Zn-3 Bi, or an Sn—Pb-based solder such as Sn 67%-Pb 37%.

For reference, the melting temperature (melting point) of the solder 4 made of Sn-3.0 Ag-0.5 Cu or Sn-0.3 Ag-0.7 Cu is about 217° C., and the melting temperature (melting point) of the solder 4 made of Sn-0.7

Cu is about 227° C. The melting temperature (melting point) of the solder 4 made of Sn-8 Zn-3 Bi is about 187 to 196° C., and the melting temperature (melting point) of the solder 4 made of Sn 67%-Pb 37% is about 183° C.

The mounted substrate 1 is also provided with a plurality of electronic components 5 such as a chip mounted on the solders 4. Each of the electronic components 5 is provided with a plurality of electrode portions 6 comprised of electrodes and leads. Each of the electrode portions 6 is joined with each predetermined solder 4. The electrode portion 6 and the electrode pattern 3 are electrically connected with each other via the solder 4.

Furthermore, the electronic component 5 is fixed by the solder 4. According to one or more embodiments, with a view to enhancing the fixation, a certain electronic component 5 that is more likely to be dropped off (for example, an electronic component 5 having a relatively large weight) out of the plurality of electronic components 5 is additionally fixed by an adhesive 7 applied on the substrate 2. The adhesive 7 is an insulating adhesive having thermosetting property.

The adhesive 7 may have a curing temperature that is lower than the melting temperature of the solder 4 in one case or may have a curing temperature that is higher than the melting temperature of the solder 4 in the other case. A component mounting system 13 described later employs different techniques in the respective cases to set the mounting height of the electronic component 5. This will be described later in detail.

The following describes the manufacturing system 10 configured to manufacture the mounted substrate 1. As shown in FIG. 1, the manufacturing system 10 includes a first solder printing device 11, an adhesive application device 12, a component mounting system 13 and a first reflow device 14 arranged sequentially from an upstream side (upper left side in the drawing) along a transfer line of the substrate 2.

The first solder printing device 11 is configured to print a predetermined amount of the solder 4 on the electrode patterns 3 of the substrate 2. More specifically, the first solder printing device 11 is provided with a metal screen (not shown) that has a plurality of holes formed at positions corresponding to the electrode patterns 3 and uses this metal screen to screen print the solder 4 on the substrate 2.

The adhesive application device 12 is configured to apply a predetermined amount of the adhesive 7 at a predetermined position on the substrate 2 (for example, a position where a predetermined electronic component 5 is expected to be placed). The adhesive application device 12 is provided with, for example, a nozzle head (not shown) that is movable in an X-Y direction and causes the adhesive 7 to be ejected from the nozzle head and to be applied on the substrate 2.

The component mounting system 13 includes a printing state/application state inspection device 41 (hereinafter may be simply referred to as "inspection device 41") configured to perform an inspection of the printed solder 4 and an inspection of the applied adhesive 7, a branch device 37, and a first component mounting machine 42 configured to mount the electronic component 5. According to one or more embodiments, the inspection device 41 corresponds to the solder inspection device and the adhesive inspection device. According to one or more embodiments, the first component mounting machine 42 corresponds to the component mounting machine. The details of the component mounting system 13 will be described later.

The first reflow device 14 is configured to heat and melt the solder 4 and to heat and cure the adhesive 7. In the substrate 2 that goes through a reflow process by the first reflow device 14, the solder 4 serves to bring the electrode patterns 3 into electrical contact with the electrode portions 6, whereas the adhesive 7 serves to firmly fix the electronic components 5.

A first mounting state inspection device 21 is provided on a downstream side of the component mounting system 13 to inspect the state of the mounted electronic components 5. Additionally, a first soldering state inspection device 22 is provided on a downstream side of the first reflow device 14 to inspect whether the soldering state is appropriate.

Furthermore, branch devices 31 and 32 are provided respectively between the first mounting state inspection device 21 and the first reflow device 14 and between the first soldering state inspection device 22 and a substrate reversing device 15 described later. The branch devices 31 and 32 are respectively configured to guide the substrate 2 determined as a non-defective by the respective inspection devices 21 and 22 located on their immediate upstream sides toward respective downstream sides and to guide the substrate 2 determined as a defective by the respective inspection devices 21 and 22 located on their immediate upstream sides to non-illustrated predetermined defective storage portions.

The respective devices including the first solder printing device 11 and the adhesive application device 12 described above serve to respectively perform various processes with regard to the surface of the substrate 2 and with regard to the solder 4 and the like provided on this surface.

The substrate 2 that goes through the processing on the surface of the substrate 2 and the like is guided from the branch device 32 to the substrate reversing device 15. The substrate reversing device 15 is a device configured to reverse the front/back faces of the substrate 2 conveyed from its upstream side. This causes the mounted surface of the substrate 2 with the electronic components 5 mounted thereon to face down. The electronic component 5 that is likely to be dropped off is fixed in advance by the adhesive 7 and is thus unlikely to be actually dropped off.

The front-back reversed substrate 2 is guided from the substrate reversing device 15 toward various devices configured to perform various processes with regard to the rear face of the substrate 2 and with regard to the solder 4 and the like provided on this rear face. The manufacturing system 10 includes a second solder printing device 16, a second component mounting machine 17 and a second reflow device 18 on the downstream side of the substrate reversing device 15.

The second solder printing device 16 has similar functions to those of the first solder printing device 11. The second reflow device 18 has similar functions to those of the first reflow device 14. The second component mounting machine 17 has substantially similar functions to those of the first component mounting machine 42 and is configured to correct a mounting position, for example, based on results of measurement with regard to the solder 4 input from a printing state inspection device 23 described below and to mount the electronic component 5 at the corrected mounting position.

The printing state inspection device 23 is provided on the downstream side of the second solder printing device 16. A second mounting state inspection device 24 is provided on the downstream side of the second component mounting machine 17. The printing state inspection device 23 has a function corresponding to the function of inspecting the solder 4 in the inspection device 41 and a function corresponding to the function of outputting the measurement result with regard to the solder 4 in the inspection device 41. The second mounting state inspection device 24 has similar functions to those of the first mounting state inspection device 21.

Moreover, a second soldering state inspection device 25 and an electrical continuity inspection device 26 are provided on the downstream side of the second reflow device 18. The second soldering state inspection device 25 has similar functions to those of the first soldering state inspection device 22. The electrical continuity inspection device 26 is configured to inspect whether the electrical continuity is appropriately ensured after soldering.

Furthermore, branch devices 33, 34, 35 and 36 are provided respectively on the immediate downstream sides of the respective inspection devices 23, 24, 25 and 26. The branch devices 33 to 36 are respectively configured to guide the substrate 2 determined as a non-defective by the respective inspection devices 23 to 26 located on their immediate upstream sides toward respective downstream sides and to guide the substrate 2 determined as a defective by the respective inspection devices 23 to 26 located on their immediate upstream sides to non-illustrated predetermined defective storage portions. The substrate 2 (i.e., the mounted substrate 1) determined as a non-defective by the electrical continuity inspection device 26 is guided to a non-defective takeout portion 27. The mounted substrate 1 eventually obtained is taken out from the non-defective takeout portion 27.

Figure 4:
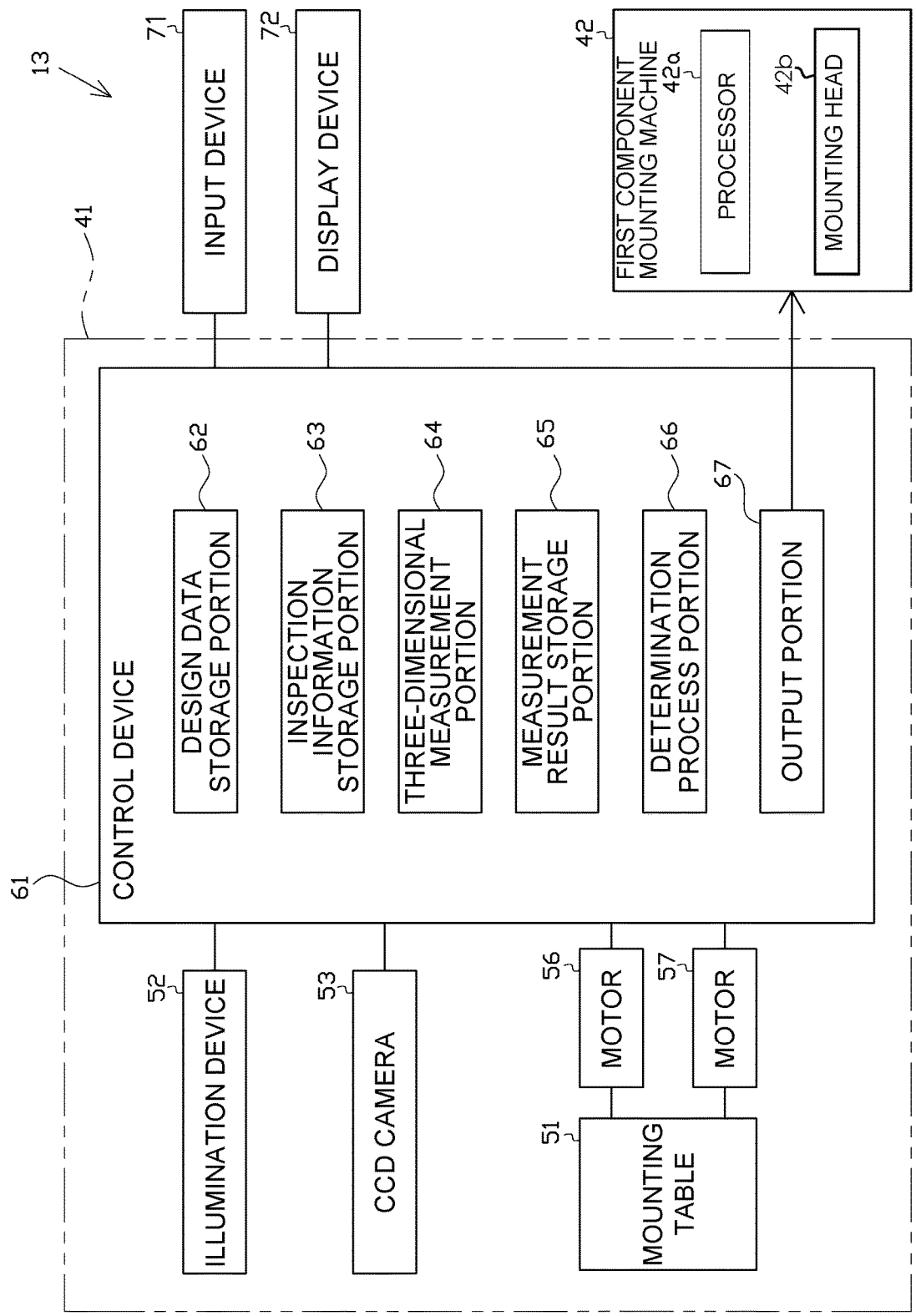
FIG. 4 is a block diagram illustrating the schematic configuration of a component mounting system according to one or more embodiments.

The following describes the component mounting system 13. As shown in FIG. 4, the component mounting system 13 includes the inspection device 41 and the first component mounting machine 42.

The inspection device 41 is described first. The inspection device 41 is provided on the downstream side of the adhesive application device 12 and is configured to perform an inspection with regard to the printing position, the height, the quantity and the like of the solder 4 and an inspection with regard to the applying position, the height, the quantity and the like of the adhesive 7.

Figure 5:
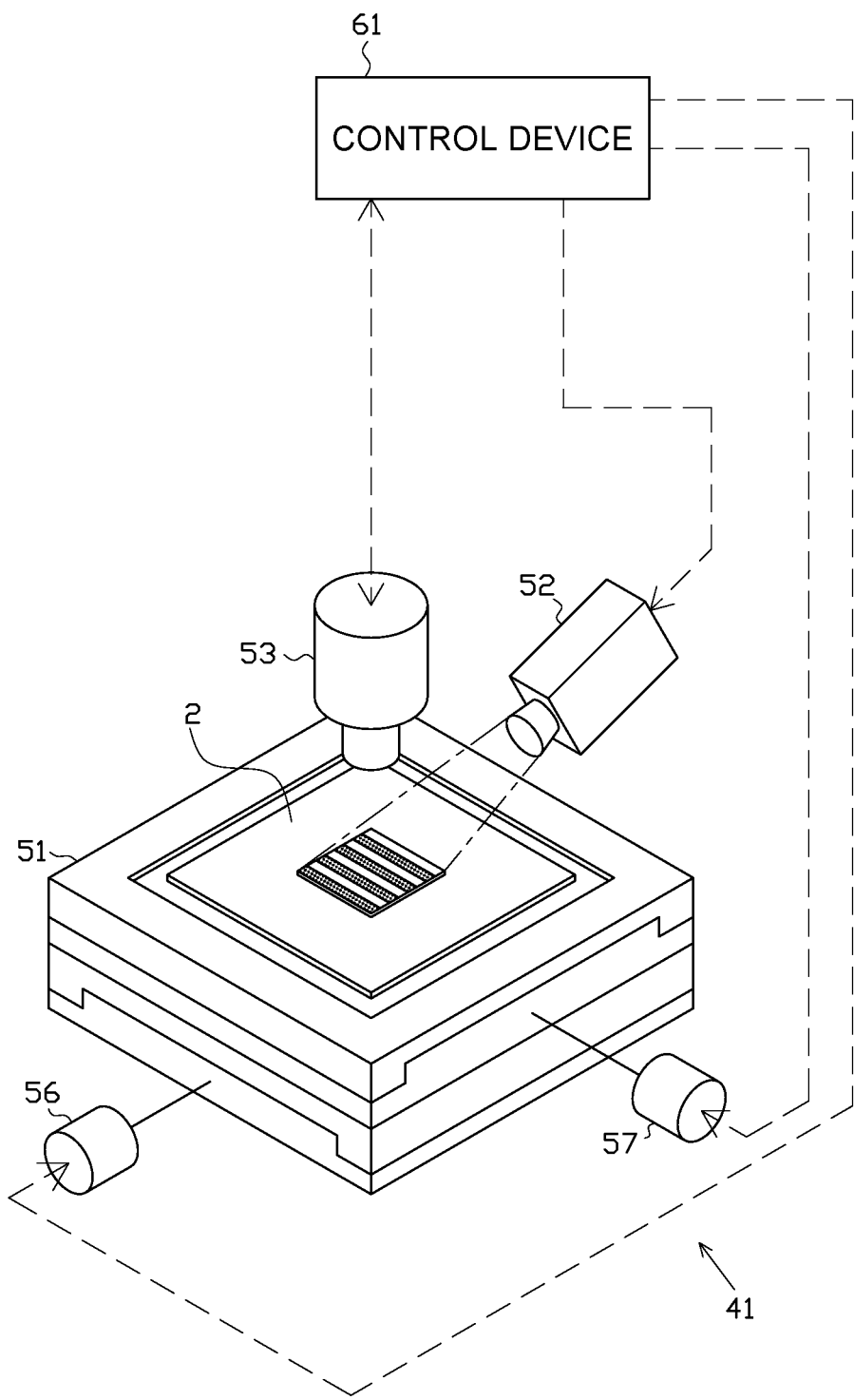
FIG. 5 is a diagram illustrating the schematic configuration of a printing state/application state inspection device according to one or more embodiments.

FIG. 5 is a schematic configuration diagram schematically illustrating the inspection device 41 according to one or more embodiments. As shown in this figure, the inspection device 41 includes a mounting table 51, an illumination device 52 serving as the irradiation unit (irradiator), a CCD camera 53 serving as the imaging unit (imaging device), and a control device (processor) 61.

The mounting table 51 is a base which the substrate 2 is placed on. The mounting table 51 is provided with motors 56 and 57. The control device 61 drives and controls these motors 56 and 57, such as to move the substrate 2 placed on the mounting table 51 in an arbitrary direction (X-axis direction and Y-axis direction).

The illumination device 52 is configured to irradiate at least the solders 4 and the adhesives 7 on the surface (upper face) of the substrate 2 obliquely downward with a predetermined light component pattern.

The CCD camera 53 has sensitivity to the light reflected from the substrate 2 or the like and takes an image of at least the solders 4 and the adhesives 7 irradiated with the light component pattern. The image (image data) taken by such imaging is input into the control device 61.

Referring back to FIG. 4, the electrical configuration of the control device 61 is described. The control device 61 is configured by a computer system including, for example, a CPU, a ROM, a RAM, a storage medium such as a hard disk and I/O ports. The control device 61 is configured to control the entire inspection device 41 and to perform various controls, image processing and arithmetic processing in the inspection device 41.

The control device 61 includes a design data storage portion 62, an inspection information storage portion 63, a three-dimensional measurement portion 64 serving as the three-dimensional measurement unit and the adhesive height measurement unit, a measurement result storage portion 65, a determination process portion 66 serving as the solder good/poor quality determination unit and the adhesive good/poor quality determination unit, and an output portion 67 serving as the output unit.

The design data storage portion 63 is configured by, for example, a RAM or a hard disk drive. Design data with regard to the mounted substrate 1 is stored in advance in the design data storage portion 63.

The design data includes, for example, the positions and the sizes of the electrode patterns 3 on the substrate 2, the expected printing positions of the solders 4, the sizes of the solders 4 (for example, the length of each side of each solder 4, the height, the area, the contour length of the solder 4, the length of the diagonal of the solder 4 and the volume of the solder 4 and the like) in an ideal printing state, the expected application positions of the adhesives 7, the sizes of the adhesives 7 (for example, the area, the height, the contour length, the volume and the like of each of the adhesives 7) in an ideal application state, various pieces of information with regard to the electronic components 5, such as the expected placement position of each of the electronic components 5 and the configuration of the electrode portions 6, and the dimensions of the substrate 2. The data with regard to the configuration of the electrode portions 6 includes information with regard to a difference in height between each electrode portion 6 (for example, a bottom-most position of the electrode portion 6) and a bottom face of the electronic component 5. The design data also includes, for example, information regarding which of the solders 4 is used to mount each of the electronic components 5 and information regarding which of the electronic components 5 is to be fixed by the adhesive 7.

The inspection information storage portion 63 is configured to store, in advance, inspection information that is used for inspections of the solders 4 and the adhesives 7. The inspection information includes various pieces of information that are used to perform various processes (for example, a binarization process) with regard to an image input from the CCD camera 53 and numerical information used for inspections. The numerical information used for the inspections includes, for example, inspection reference distances individually determined for the respective solders 4 and for the respective adhesives 7 to be used in the process of checking the planar positions of the respective solders 4 and the respective adhesives 7, and inspection reference heights individually determined for the respective solders 4 and for the respective adhesives 7 to be used in the process of checking the heights of the respective solders 4 and the respective adhesives 7.

According to one or more embodiments, the inspection reference height of the solder 4 or the adhesive 7 is specified by a numerical range from a predetermined lower limit value to a predetermined upper limit value. Especially, the inspection reference height of the adhesive 7 is set in advance, based on an ideal mounting height of an electronic component 5 (fixation target electronic component) that is to be fixed by the adhesive 7 as an inspection target (determination target adhesive) in the design data. More specifically, the inspection reference height of the adhesive 7 is determined by taking into account a difference of height HD between an electrode portion 6 included in the electronic component 5 (fixation target electronic component) and a bottom face of the electronic component 5 (as shown in FIG. 3) in the design data. For example, the inspection reference height of the adhesive 7 that is used to fix an electronic component 5 having a relatively large difference HD is specified by a numerical range between a relatively large lower limit value and a relatively large upper limit value. The inspection reference height of the adhesive 7 that is used to fix an electronic component 5 having a relatively small difference HD is specified by a numerical range between a relatively small lower limit value and a relatively small upper limit value. The inspection reference height may be determined as a numerical range that is not less than a predetermined lower limit value. In other words, the upper limit value may not be necessarily determined.

The three-dimensional measurement portion 64 is configured to perform three-dimensional measurement with regard to the heights and the volumes of the solders 4 and the adhesives 7, based on the image taken by the CCD camera 53.

The measurement result storage portion 65 is configured by, for example, a hard disk drive or the like to store results of measurement performed by the three-dimensional measurement portion 64.

The determination process portion 66 is configured to use the inspection information stored in the inspection information storage portion 63 to perform a determination process with regard to the results of the measurement obtained by the three-dimensional measurement portion 64 and determine the good/poor qualities of the solders 4 and the adhesives 7.

The output portion 67 is configured to output information based on the results of the measurement stored in the measurement result storage portion 65, to the outside. According to one or more embodiments, the output portion 67 outputs information based on the results of the measurement, to the first component mounting machine 42. Information based on the results of the measurement with regard to the substrate 2 that is determined as a defective by the inspection device 41 is, however, not output to the first component mounting machine 42.

The control device 61 is also connected with an input device 71 and a display device 72.

The input device 71 is comprised of a keyboard and a mouse or comprised of a touch panel and is used for entry of information into the control device 61. The design data stored in the control device 61 and the like may be changed appropriately via the input device 71.

The display device 72 has a display screen such as a CRT or a liquid crystal screen and is configured to display information such as the design data stored in the control device 61, images taken by the CCD camera 53 and the like.

In the inspection device 41 having the configuration described above, the control device 61 controls the illumination device 52 and the CCD camera 53 to irradiate the solders 4, the adhesives 7 and the like with light by the illumination device 52 and to take an image of the solders 4 and the adhesives 7 by the CCD camera 53. This imaging is performed in the unit of each inspection area set in advance.

The three-dimensional measurement portion 64 subsequently performs three-dimensional measurement, based on the image obtained by the imaging process of the CCD camera 53. According to one or more embodiments, phase shift method is employed for the three-dimensional measurement. This accordingly measures the planar position, the height (peak height and average height), the volumetric value and the three-dimensional shape of each printed solder 4 and the planar position, the height (peak height and average height), the volumetric value and the three-dimensional shape of each applied adhesive 7. The image obtained by the imaging process may be subjected to predetermined image processing, prior to the three-dimensional measurement. According to one or more embodiments, a height along a direction perpendicular to a face (surface) of the substrate 2 which the solders 4 and the adhesives 7 are provided on is measured as the height of the solder 4 or as the height of the adhesive 7.

The results of the measurement are stored in the measurement result storage portion 65 and are used for an inspection process with regard to the solder 4 and an inspection process with regard to the adhesive 7 performed by the determination process portion 66.

The inspection process with regard to the solder 4 performs a determination process of determining whether an amount of misalignment between a measured planar position of a solder 4 and an expected printing position of the solder 4 in the design data is within the inspection reference range with regard to the solder 4. The inspection process with regard to the solder 4 also performs a determination process of determining whether the height of a solder 4 (peak height according to one or more embodiments) is equal to the inspection reference height with regard to the solder 4. When both the planar position and the height are appropriate, the solder 4 is determined good. When at least one of the planar position and the height is inappropriate, on the other hand, the solder 4 is determined poor. The item of the inspection of the solder 4 may be changed suitably. For example, an inspection may be performed based on the three-dimensional shape of the solder 4. In another example, an inspection with regard to the height of the solder 4 may be performed by using the average height of the solder 4.

The inspection process with regard to the adhesive 7 performs a determination process of determining whether an amount of misalignment between a planar position of an applied adhesive 7 and an ideal planar position of the adhesive 7 set in advance is within the inspection reference distance with regard to the adhesive 7.

The inspection process with regard to the adhesive 7 includes a process of determining whether the measured height of the adhesive 7 (peak height according to one or more embodiments) is equal to the inspection reference height with regard to the adhesive 7 and thereby determining the good/poor quality of the adhesive 7. The inspection reference height with regard to the adhesive 7 is not changed according to a variation in amount (height) of the solder 4, which the electronic component 5 (fixation target electronic component) that is to be fixed by the adhesive 7 as the inspection target (determination target adhesive) is mounted on. Accordingly, the good/poor quality of each of the adhesives 7 is determined by using a consistently fixed inspection reference height determined for each of the adhesives 7. The item of the inspection of the adhesive 7 may be changed suitably. For example, an inspection may be performed based on the three-dimensional shape of the adhesive 7. In another example, an inspection with regard to the height of the adhesive 7 may be performed by using the average height of the adhesive 7.

Such imaging and inspection described above are performed in the unit of each inspection area described above, while the mounting table 51 is moved by means of the motors 56 and 57. This accordingly inspects the respective solders 4 and the respective adhesives 7 located in the entire area of the surface (upper face) of the substrate 2. According to a modification, only a specific solder 4 and only a specific adhesive 7 may be specified as the inspection targets.

The substrate 2 subjected to the inspection by the inspection device 41 is then transferred to the branch device 37 that is provided between the inspection device 41 and the first component mounting machine 42. The substrate 2 determined good with regard to both the solder 4 and the adhesive 7 by the inspection device 41 is guided by the branch device 37 toward the first component mounting machine 42 on the downstream side. The substrate 2 determined poor with regard to at least one of the solder 4 and the adhesive 7 by the inspection device 41 is, on the other hand, guided by the branch device 37 to a non-illustrated defective storage portion.

Furthermore, with regard to the substrate 2 determined good, information based on the results of the measurement stored in the measurement result storage portion 65 is output via the output portion 67 to the first component mounting machine 42. More specifically, the inspection device 41 outputs positional misalignment information (information in two-dimensional directions) of an actual printing position of the solder 4 from an expected printing position of the solder 4, height information (peak height and average height) and volumetric value information of the solder 4 and height-related information (information in a height direction perpendicular to the surface of the substrate 2) including three-dimensional shape information of the solder 4, with regard to each electronic component 5.

The following describes the first component mounting machine 42. The first component mounting machine 42 has a mounting head 42b and is configured to pick up an electronic component 5 using the mounting head 42b and mount this electronic component 5 on the substrate 2 by utilizing the viscosity of the printed solder 4. The first component mounting machine 42 includes a computer provided with, for example, a CPU (processor), a ROM, a RAM and I/O ports. Design data with regard to the mounted substrate 1 is input in advance into the first component mounting machine 42.

The design data includes information with regard to a target mounting position of each electronic component 5. The information with regard to the target mounting position includes at least an ideal target mounting position of the electronic component 5 in an X-Y plane and an ideal target mounting height of the electronic component 5 along a height direction (Z direction) perpendicular to the surface of the substrate 2.

For example, an expected sinking amount of the electronic component 5 after a reflow process is further stored as the design data into the first component mounting machine 42. According to one or more embodiments, the expected sinking amount of the electronic component 5 denotes an expected value of the amount of sinking caused by mounting the electronic component 5 at an ideal mounting position relative to the solder 4 printed in an ideal state and is determined in advance by calculation (simulation) or the like. Another procedure may experimentally produce a plurality of mounted substrates 1, may measure in advance actual sinking amounts with regard to the plurality of mounted substrates 1, and may set a value based on the measured sinking amounts (for example, an average value or a medium value) as the expected sinking amount.

Furthermore, the first component mounting machine 42 is provided with a mounting position setting portion (i.e., the processor) 42a serving as the mounting position setting unit. The mounting position setting portion 42a is configured to set the target mounting position of the electronic component 5, based on the results of the measurement input from the output portion 67. According to one or more embodiments, the target mounting position includes at least a target mounting height of the electronic component 5 along a height direction (X direction). The target mounting position may include a planar target mounting position of the electronic component 5.

The mounting position setting portion 42a sets the target mounting height of the electronic component 5 as described below according to the magnitude relationship between the melting temperature of the solder 4 and the curing temperature of the adhesive 7.

When the curing temperature of the adhesive 7 is lower than the melting temperature of the solder 4, the mounting position setting portion 42a sets the target mounting height of the electronic component 5 to a height that is lower than an ideal mounting height of the electronic component 5 in the design data by a value corresponding to the expected sinking amount of the electronic component 5 accompanied with melting of the solder 4. In other words, when the curing temperature of the adhesive 7 is lower than the melting temperature of the solder 4, the mounting position setting portion 42a sets the target mounting height of the electronic component 5 to the height described above without making correction based on the results of the measurement. Accordingly, the target mounting height of the electronic component 5 is not changed according to a variation in amount (height) of the solder 4 which the electronic component 5 is mounted on.

When the curing temperature of the adhesive 7 is higher than the melting temperature of the solder 4, on the other hand, the mounting position setting portion 42a sets the ideal mounting height of the electronic component 5 in the design data that is corrected appropriately based on the input results of the measurement, to the target mounting height of the electronic component 5.

The first component mounting machine 42 then mounts the electronic component 5 at the target mounting height set by the mounting position setting portion 42a.

Figure 6:
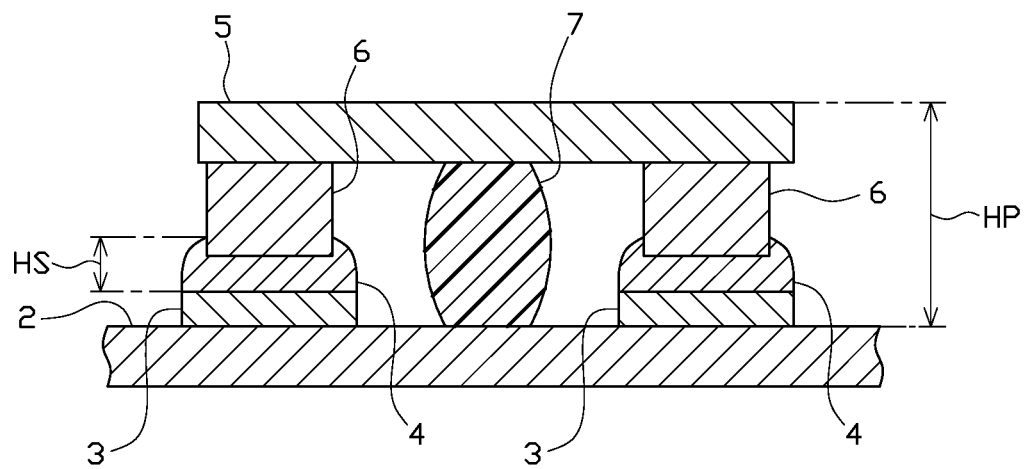
FIG. 6 is a partially enlarged sectional view illustrating no change in mounting height of an electronic component by a height variation of solder according to one or more embodiments.
Figure 7:
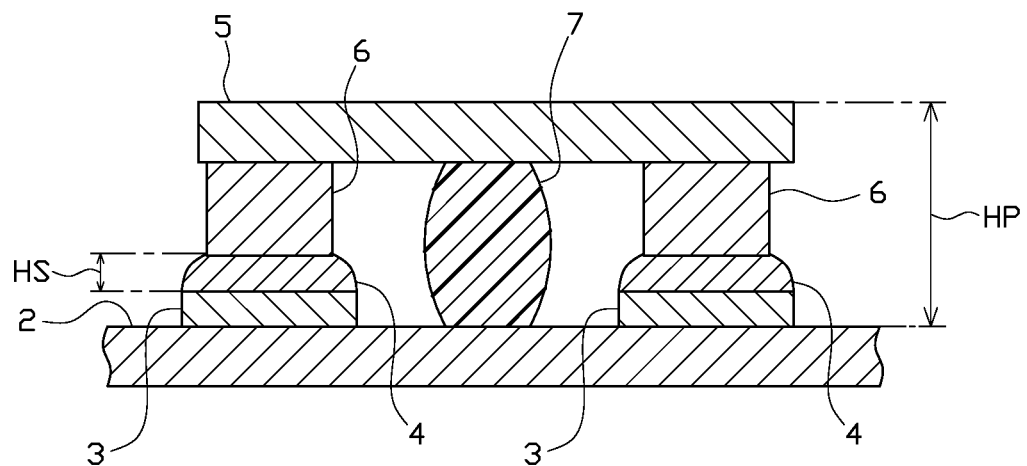
FIG. 7 is a partially enlarged sectional view illustrating no change in mounting height of the electronic component by the height variation of solder according to one or more embodiments.

Accordingly, when the curing temperature of the adhesive 7 is lower than the melting temperature of the solder 4, an electronic component 5 is mounted at such a position that is lower than an ideal mounting height of the electronic component 5 based on the design data by a value corresponding to an expected sinking amount of the electronic component 5 accompanied with melting of the solder 4, irrespective of a variation in amount (height) of the solder 4. Even when a height HS of the solder 4 is varied in an appropriate range, such setting does not change a mounting height HP of the electronic component 5 that is mounted on this solder 4, as shown in FIG. 6 and FIG. 7.

When the curing temperature of the adhesive 7 is higher than the melting temperature of the solder 4, on the other hand, an electronic component 5 is mounted at a target mounting height that is set appropriately according to the amount (height) of the solder 4. For example, when the height of the solder 4 specified from the height-related information included in the input information is greater than an ideal height of the solder 4, the electronic component 5 is mounted at an upper position away from the substrate 2. When the height of the solder 4 specified from the height-related information is greater than the ideal height of the solder 4, on the other hand, the electronic component 5 is mounted at a lower position near to the substrate 2.

As described above in detail, according to one or more embodiments, the first component mounting machine 42 includes the mounting position setting portion 42a configured to set the target mounting height of the electronic component 5, based on the results of the measurement of the solder 4 by the three-dimensional measurement portion 64. The first component mounting machine 42 can thus mount the electronic component 5 at the set target mounting height. This configuration accordingly enables the electronic component 5 to be placed at a more appropriate position corresponding to the state of formation of the solder 4. For example, with regard to the electronic component 5 which is to be fixed by the adhesive 7 that cures at a temperature higher than the melting temperature of the solder 4, the first component mounting machine 42 mounts this electronic component 5 at a height corresponding to the actual height of the solder 4.

With regard to the electronic component 5 which is to be fixed by the adhesive 7 that cures at a temperature lower than the melting temperature of the solder 4, on the other hand, the mounting position setting portion 42a sets the target mounting height to such a height that is lower than the ideal mounting height based on the design data by the value corresponding to the sinking amount of the electronic component 5 accompanied with melting of the solder 4. In other words, the target mounting height of the electronic component 5 which is to be fixed by the adhesive 7 that cures at the temperature lower than the melting temperature of the solder 4 is set to the height described above, irrespective of the amount (height) of the solder 4. Accordingly, when the adhesive 7 cures to fix the electronic component 5 prior to melting of the solder 4, the electronic component 5 is placed at such a position that is lower than an ordinary placement position (ideal mounting height). This configuration more reliably prevents the electronic component 5 from being fixed at a position protruded from the ordinary placement position and thereby prevents the occurrence of a dimensional error. Furthermore, this configuration more effectively ensures the electrical contact between the electrode portion 6 of the electronic component 5 and the electrode pattern 3 of the substrate 2 and more reliably prevents the occurrence of soldering failure. As a result, this configuration enhances the yield.

More specifically, according to one or more embodiments, the target mounting height is set to the height that is lower than the ideal mounting height by the value corresponding to the sinking amount of the electronic component accompanied with melting of the solder. This configuration enables the electronic component 5 to be fixed by the curing adhesive 7 at a more appropriate position that takes account of the sinking amount accompanied with melting of the solder 4. This configuration thus more reliably provides the electrical contact between the electrode portion 6 and the electrode pattern 3 and further enhances the yield.

An inspection of the adhesive 7 is performed by determining whether the height of the adhesive 7 is equal to the predetermined inspection reference height that is based on the target mounting height of the electronic component 5, irrespective of the amount of the solder 4. In other words, an inspection of the adhesive 7 is performed, based on the inspection reference height that is not changed according to a variation in amount (for example, height) of the solder 4. Accordingly, compared with a configuration that changes the inspection reference height according to a variation in amount (height) of the solder 4, this configuration reduces the probability that the adhesive 7 is determined poor due to an insufficient height, despite that the adhesive 7 actually has no substantial problem for fixation of the electronic component 5 and the like. As a result, this configuration ensures the more accurate good-quality determination of the adhesive 7 that is supposed to be determined good, and thereby further enhances the yield.

Additionally, the inspection reference height is based on the target mounting height of the electronic component 5, so that an inspection of the adhesive 7 is performed according to the mounting height of the electronic component 5. As a result, this configuration ensures the more accurate good/poor quality determination of the adhesive 7.

Moreover, the inspection reference height is determined by taking into account a difference in height between the electrode portion 6 of the electronic component 5 that is fixed by the adhesive 7 as the inspection target and the bottom face of the electronic component 5. Accordingly, this configuration enables an inspection to be performed more accurately to determine whether the adhesive 7 comes into contact with the bottom face of the electronic component 5, i.e., whether the electronic component 5 is allowed to be fixed by the adhesive 7, without taking into account the detailed shape of the electronic component 5. This ensures the more accurate good/poor quality determination of the adhesive 7 by a relatively simple technique and further enhances the yield.

The present invention is not limited to the description of the above embodiments but may be implemented, for example, by configurations described below. The present invention may also be naturally implemented by applications and modifications other than those illustrated below.

(a) According to the embodiments described above, when the curing temperature of the adhesive 7 is lower than the melting temperature of the solder 4, the target mounting height of the electronic component 5 is set to the height that is lower than the ideal mounting height of the electronic component 5 in the design data by the value corresponding to the expected sinking amount of the electronic component 5 accompanied with melting of the solder 4. When the curing temperature of the adhesive 7 is lower than the melting temperature of the solder 4, a modification may, however, be configured to set the target mounting height of the electronic component 5 to the ideal mounting height of the electronic component 5 in the design data.

(b) According to the embodiments described above, the first component mounting machine 42 is configured to appropriately change the mounting height of the electronic component 5. According to a modification, however, the first component mounting machine may be configured to mount the electronic component 5 at a fixed height that is set in advance when the first component mounting machine is used only under the condition that the curing temperature of the adhesive 7 is lower than the melting temperature of the solder 4. The first component mounting machine of this modification may consistently set the target mounting height of the electronic component 5 to the ideal mounting height of the electronic component 5 in the design data or to the height that is lower than the ideal mounting height by the value corresponding to the expected sinking amount of the electronic component 5 accompanied with melting of the solder 4. Using this first component mounting machine may allow for omission of the inspection device 41 or the mounting position setting portion 42a.

(c) According to the embodiments described above, the information with regard to the height, the volumetric value and the three-dimensional shape of the solder 4 is output as the height-related information. According to a modification, however, at least one of these pieces of information may be output as the height-related information.

(d) According to the embodiments described above, both the peak height and the average height are output to indicate the heights of the solder 4 and the adhesive 7. According to a modification, however, only one of the peak height and the average height may be output.

(e) According to the embodiments described above, the phase shift technique is employed as the three-dimensional measurement method. Any of other various techniques such as an optical cutting method, a moire technique, a focusing technique, a confocal technique, a spatial code method, and a checkered projection method may be employed as the three-dimensional measurement method.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

2 . . . substrate, 4 . . . solder paste (solder), 5 . . . electronic component, 6 . . . electrode portion, 7 . . . adhesive, 13 . . . component mounting system, 41 . . . printing state/application state inspection device (solder inspection device, adhesive inspection device), 42 . . . first component mounting machine (component mounting machine), 42a . . . mounting position setting portion (mounting height setting unit), 52 . . . illumination device (irradiation unit), 53 . . . CCD camera (imaging unit), 64 . . . three-dimensional measurement portion (three-dimensional measurement unit, adhesive height measurement unit), 66 . . . determination process portion (solder good/poor quality determination unit, adhesive good/poor quality determination unit), 67 . . . output portion (output unit)

The invention claimed is:

1. A component mounting system comprising:
a component mounting machine that mounts an electronic component having a predetermined electrode portion on a solder printed on a substrate, wherein the electronic component is fixed to the substrate with a thermosetting adhesive; and
an adhesive inspection device, wherein
the component mounting machine:
sets, with regard to the electronic component to be fixed with the adhesive that cures at a temperature lower than a melting temperature of the solder, a target mounting height along a height direction perpendicular to a face of the substrate on which the adhesive is applied; and
mounts the electronic component at the target mounting height,
wherein the target mounting height is:
an ideal mounting height based on design data; or
a height lower than the ideal mounting height by a value that corresponds to a sinking of the electronic component as a result of melting of the solder;
the adhesive inspection device comprises a processor that:
measures a height of the adhesive relative to the substrate;
determines a quality of the adhesive based on the height of the adhesive; and
when the adhesive whose quality is a determination target is specified as a determination target adhesive, and the electronic component to be fixed with the determination target adhesive is specified as a fixation target electronic component,
determines the quality of the determination target adhesive based on whether a height of the determination target adhesive is equal to a predetermined inspection reference height, irrespective of an amount of the solder on which the fixation target electronic component is mounted,
wherein the predetermined inspection reference height is based on the target mounting height of the fixation target electronic component.

2. The component mounting system according to claim 1, further comprising:
a solder inspection device that comprises:
an irradiator that irradiates the solder with predetermined light;
an imaging device that takes an image of the solder irradiated with the light by the irradiator; and the processor, wherein
the processor further:
performs three-dimensional measurement of the solder based on the image taken by the imaging device;
determines a quality of the solder based on a result of the three-dimensional measurement; and
outputs height-related information of the solder along the height direction based on the result of the three-dimensional measurement, and
the component mounting machine sets the target mounting height based on the height-related information, and mounts the electronic component at the target mounting height.

3. The component mounting system according to claim 1, wherein the inspection reference height is determined based on a difference in height between the electrode portion of the fixation target electronic component and a bottom face of the fixation target electronic component.

4. An adhesive inspection device that performs an inspection of a thermosetting adhesive after the adhesive is applied on at least one face out of a surface and a rear face of a substrate and before an electronic component is mounted on a solder printed on the substrate, wherein the electronic component is fixed to the at least one face with the adhesive, the adhesive inspection device comprising:
a processor that:
measures a height of the adhesive relative to the substrate;
determines a quality of the adhesive based on the height of the adhesive; and
when the adhesive whose quality is a determination target is specified as a determination target adhesive, and the electronic component to be fixed with the determination target adhesive is specified as a fixation target electronic component,
determines the quality of the determination target adhesive based on whether a height of the determination target adhesive is equal to a predetermined inspection reference height, irrespective of an amount of the solder on which the fixation target electronic component is mounted,
wherein the predetermined inspection reference height is based on:
an ideal mounting height of the fixation target electronic component based on design data, or
a height lower than the ideal mounting height by a value that corresponds to a sinking of the fixation target electronic component as a result of melting of the solder.

5. The adhesive inspection device according to claim 4, wherein the inspection reference height is determined based on a difference in height between an electrode portion of the fixation target electronic component and a bottom face of the fixation target electronic component.

6. A component mounting system comprising:
a component mounting machine that:
mounts an electronic component having a predetermined electrode portion on a solder printed on a substrate, the electronic component being fixed to the substrate with a thermosetting adhesive, and
comprises:
a processor that:
stores, as design data, an ideal mounting height and an expected sinking amount of the electronic component,
receives, from a solder inspection device, height-related information of the solder,
with regard to the adhesive that cures at a temperature lower than a melting temperature of the solder, sets a target mounting height to a height lower than the ideal mounting height by the expected sinking amount regardless of the height-related information, wherein the target mounting height is along a height direction perpendicular to a face of the substrate on which the adhesive is applied, and
with regard to the adhesive that cures at a temperature higher than the melting temperature, sets the target mounting height to a height obtained by correcting the ideal mounting height based on the height-related information; and a mounting head mounts the electronic component at the target mounting height.

7. The component mounting system according to claim 6, further comprising:
the solder inspection device that comprises:
an irradiator that irradiates the solder with predetermined light;
an imaging device that takes an image of the solder irradiated with the light by the irradiator; and
a processor that:
performs three-dimensional measurement of the solder based on the image taken by the imaging device;
determines a quality of the solder based on a result of the three-dimensional measurement; and
outputs the height-related information of the solder along the height direction based on the result of the three-dimensional measurement, wherein
the processor sets the target mounting height based on the height-related information.

8. A component mounting method for mounting an electronic component that comprises a predetermined electrode portion on a solder printed on a substrate and for fixing the electronic component to the substrate with a thermosetting adhesive, using a component mounting machine that comprises a processor and a mounting head, the method comprising:
storing, by the processor as design data, an ideal mounting height and an expected sinking amount of the electronic component,
receiving, by the processor from a solder inspection device, height-related information of the solder,
with regard to the adhesive that cures at a temperature lower than a melting temperature of the solder, setting, by the processor, a target mounting height to a height lower than the ideal mounting height by the expected sinking amount regardless of the height-related information, wherein the target mounting height is along a height direction perpendicular to a face of the substrate on which the adhesive is applied,
with regard to the adhesive that cures at a temperature higher than the melting temperature, setting, by the processor, the target mounting height to a height obtained by correcting the ideal mounting height based on the height-related information; and
mounting, by the mounting head, the electronic component at the target mounting height.

9. A component mounting method for mounting an electronic component that comprises a predetermined electrode portion on a solder printed on a substrate and for fixing the electronic component to the substrate with a thermosetting adhesive, the method comprising:
mounting the electronic component at a target mounting height along a height direction perpendicular to a face of the substrate on which the adhesive is applied,
wherein the electronic component is fixed with the adhesive that cures at a temperature lower than a melting temperature of the solder, and
wherein the target mounting height is:
an ideal mounting height based on design data; or
a height lower than the ideal mounting height by a value that corresponds to a sinking of the electronic component as a result of melting of the solder;

measuring, by an adhesive inspection device, a height of the adhesive relative to the substrate;
determining, by the adhesive inspection device, a quality of the adhesive based on the height of the adhesive; and
when the adhesive whose quality is a determination target is specified as a determination target adhesive, and the electronic component to be fixed by the determination target adhesive is specified as a fixation target electronic component,
determining, by the adhesive inspection device, the quality of the determination target adhesive based on whether a height of the determination target adhesive is equal to a predetermined inspection reference height, irrespective of an amount of the solder on which the fixation target electronic component is mounted,
wherein the predetermined inspection reference height is based on the target mounting height of the fixation target electronic component.

10. An adhesive inspection method for inspecting a thermosetting adhesive after the adhesive is applied on at least one face out of a surface and a rear face of a substrate and before an electronic component is mounted on a solder printed on the substrate, wherein the electronic component is fixed to the at least one face with the adhesive, the method comprising:
measuring a height of the adhesive relative to the substrate;
determining a quality of the adhesive based on the height of the adhesive; and
when the adhesive whose quality is a determination target is specified as a determination target adhesive, and the electronic component to be fixed by the determination target adhesive is specified as a fixation target electronic component,
determining the quality of the determination target adhesive based on whether a height of the determination target adhesive is equal to a predetermined inspection reference height, irrespective of an amount of the solder on which the fixation target electronic component is mounted,
wherein the predetermined inspection reference height is based on:
an ideal mounting height of the fixation target electronic component based on design data; or
a height lower than the ideal mounting height by a value that corresponds to a sinking of the fixation target electronic component as a result of melting of the solder.

11. A manufacturing method for manufacturing a substrate by using the component mounting method according to claim 8.

12. The component mounting system according to claim 2,
wherein the inspection reference height is determined based on a difference in height between the electrode portion of the fixation target electronic component and a bottom face of the fixation target electronic component.

13. A manufacturing method for manufacturing a substrate by using the component mounting method according to claim 9.

14. A manufacturing method for manufacturing a substrate by using the adhesive inspection method according to claim 10.

* * * * *